United States Patent Office 3,362,824
Patented Jan. 9, 1968

3,362,824

PROCESS FOR PREPARING PHOTOGRAVURE PRINTING PLATES

Johan Lodewijk Verelst, Kontich, Belgium, assignor to Gevaert Photo-Producten N.V., Mortsel, Belgium, a Belgian company No Drawing. Filed May 1, 1964, Ser. No. 364,321
Claims priority, application Netherlands, May 1, 1963, 292,176
7 Claims. (Cl. 96—36)

A photogravure printing plate is often prepared with the aid of an etching resist, which is applied to a metal surface and which etching resist, according to its pattern, allows the iron (III) chloride etching liquid to penetrate and to attack the underlying metal layer.

Photography is applied very often to the preparation of etching resists. Etching resists can be prepared by image-wise exposing and hardening a dichromate-sensitised layer, which contains a hardenable hydrophilic colloid, or a light-sensitive silver halide layer containing hardenable hydrophilic colloid, transferring the resulting image-wise hardened layer to the metal surface to be etched, and finally removing the unhardened areas.

The etching process preferably occurs slowly since this usually leads to the production of better photogravure printing plates. When the etching is performed slowly, there is a risk that the etching liquid would penetrate also to the areas where it should not etch and would attack the metal surface at these areas also.

In order to prevent this disadvantage one was obliged to employ a rather thick etching resist. Up to the present it was necessary that the etching resists obtained from a dichromate-sensitised layer have a thickness of at least 15 microns, whereas the etching resists obtained from a light-sensitive silver halide emulsion layer have a thickness of at least 23 microns. This difference of thickness is due to the nature of the hardening which the light-sensitive layer has undergone.

A thicker etching resist is not necessarily disadvantageous. Yet, if such thicker etching resist is prepared according to one of both above-described photographic processes, one is bound to employ rather thick light-sensitive layers, i.e., the dichromate-sensitised layer should be at least 40 microns thick in order to obtain an etching resist having a thickness of at least 15 microns and the silver halide emulsion layer should be at least 25 microns thick in order to obtain an etching resist having a thickness of 23 microns.

The use of such thick light-sensitive layers to be hardened image-wise involves many disadvantages, such as an extension of the exposure time, a loss of dimensional stability and a strong curling of the light-sensitive material since thicker layers exert a higher tensile force on the support.

The great advantage of the present invention consists in providing a light-sensitive material containing a thinner light-sensitive layer to be hardened image-wise.

It has been found that from a dichromate-sensitised layer, containing a hardenable hydrophilic colloid, and manifesting a thickness of at most 30 microns, or from a light-sensitive silver halide emulsion layer containing a hardenable hydrophilic colloid and possessing a thickness of at most 20 microns etching resists can be prepared, which during a slow etching process do not permit the iron (III) chloride etching liquid to penetrate to the metal surface to be etched in those areas where the etching liquid must not penetrate, by incorporating in the light-sensitive layer a member selected from the group consisting of a high molecular weight substance insoluble in acid medium and a high molecular weight substance, which in acid medium forms an insoluble complex with the hydrophilic colloid. These high molecular weight substances will be designated hereinafter as polymers insoluble in acid medium.

The etching resists obtained from the above light-sensitive layers having a thickness of at most 30 and 20 microns respectively manifest a thickness of at most approximately 10 microns and 18 microns respectively. It may be assumed that the high molecular weight substance insoluble in acid medium or the complex insoluble in acid medium, formed by the high molecular weight substance and the hydrophilic colloid present in the etching resist slows down the penetration of the acid etching liquid. This allows a slow etching process for such thin etching resists without bringing about, however, the penetration of the etching liquid to the areas where the etching liquid must not etch.

High molecular weight substances, which are insoluble in acid medium and particularly suited for being incorporated into the light-sensitive material according to the present invention are, i.a., poly(vinyl maleate), copoly (styrene/maleic anhydride), certain gelatin derivatives comprising acid groups such as the reaction product of gelatin and phthalic anhydride, and water-soluble ethyl cellulose phthalates.

Particularly suited mixtures of a high molecular weight substance and a hydrophilic colloid, that form a complex insoluble in acid medium are, i.a., a mixture of a water-soluble salt of ethyl cellulose-sulphobenzoic acid and poly(vinyl alcohol), and a mixture of poly(styrene sulphonic acid) (usually applied in the form of a water-soluble salt) and gelatin.

The preparation of these polymers insoluble in acid medium is frequently described in the patent literature and generally known.

Polymers insoluble in acid medium having a relatively low molecular weight viz. comprised between approximately 3,000 and 20,000 are found to be especially suited for being used according to the present invention. The polymer insoluble in acid medium should be miscible, of course, with the hardenable hydrophilic colloid used.

The proportion of polymer insoluble in acid medium to hardenable hydrophilic colloid in the light-sensitive layer mainly depends on the nature of these products. According to the present invention, however, the polymer insoluble in acid medium is commonly used in a concentration ranging from 2 to 20% by weight of the total amount of binder of the light-sensitive layer.

If a dichromate-sensitised layer is employed in a process according to the present invention, this usually occurs in the form of pigment paper. This pigment paper can be prepared by applying an aqueous dispersion of a hardenable hydrophilic colloid such as fish-glue, poly(vinyl alcohol), gelatin or another protein and a pigment such as iron (III) oxide, to a suited support, e.g. or paper, in such a way that, upon drying, a layer is obtained having a thickness of at most 30 microns, soaking the resulting material with a solution of a dichromate and occasionally glazing this material. Obviously the concentration of pigment is to be chosen such that during the exposure of this light-sensitive material, the light rays cannot penetrate too deeply, so that accordingly the hardening of the hydrophilic colloid cannot proceed too deeply. Indeed, in the latter case the elimination of the support would become very difficult, if not impossible. This light-sensitive material is then exposed for a period usual when employing pigment paper (usually some minutes shorter) to a screen and to a continuous tone original (the sequence of both exposures is not important), thus causing the light-sensitive layer to be hardened and become insoluble in water at the exposed areas as deeply as the light rays penetrate into the light-sensitive layer. The depth of the hardening will be at most approximatively 10 microns.

An etching resist is obtained by transferring the image-wise hardened layer to the metal surface to be etched, usually a copper plate or cylinder, and by removing the support and the unhardened areas of the light-sensitive layer, usually by washing away. Etching can now be started by means of the usual solutions of iron (III) chloride.

If an etching resist is produced from a light-sensitive silver halide emulsion layer according to a process of the present invention, use is made commonly of the so-called photogravure film comprising successively a hydrophobic flexible support, a stripping layer, a hydrophobic flexible membrane, and a light-sensitive silver halide emulsion layer having a thickness of at most 20 microns, and containing hardenable hydrophilic colloid such as gelatin or another protein and at least one polymer insoluble in acid medium. The photogravure film may contain additional layers such as an antihalation layer or layers for composing a photogravure film as described detailedly in the French patent specifications 1,281,283 and 1,343,420 and in the Belgian patent specification 635,575. This light-sensitive material is exposed first through a screen and subsequently to a continuous tone original or conversely, and finally it is tanningly developed. The photogravure film is then pressed to the metal surface to be etched, e.g. a copper cylinder or plate. The temporary and permanent supports are then eliminated, the former usually by merely stripping and the latter by dissolving or according to a process described in the French patent specification 1,281,-283. The unhardened areas of the light-sensitive emulsion layer are then removed, usually by washing away with water. The treatment is then further proceeded as described above for pigment paper. The thickness of the etching resist is at most approximately 18 microns.

In the foregoing description of pigment paper and photogravure film as well as of the preparation of photogravure printing plates from such light-sensitive materials, the fundamental principles are stated only. For more particulars the well-known detailed literature existing on this matter may be referred to e.g. Lexikon für das grafische Gewerbe (1958) by Ernst Born (pp. 381–382, 417 and 474–480, Practical Printing and Binding (1946), edited by Hong Whetton (pp. 298–307), and especially Rotogravure (1956) by H. M. Cartwright and Robert MacKay (pp. 120–264).

The following comparative tests clearly indicate that with the considerably thinner light-sensitive layers used according to the invention an etching procedure (etching duration) is obtained which is practically the same as that of the etching resists obtained from the thicker light-sensitive layers utilised up to the present.

TEST 1

Four photogravure films 1, 2, 3 and 4 are provided with a light-sensitive layer, from the following suspensions respectively.

*Suspension 1*

| | Percent |
|---|---|
| An unsensitised gelatin silver bromochloride emulsion (25 mole percent of chloride) | 25 |
| A green-sensitised aqueous gelatin silver chloride emulsion | 75 |

This suspension is coated such that upon drying 28 g. of dry substance are present per sq. m., which corresponds with a thickness of the light-sensitive layer of approximatively 26 microns.

*Suspension 2*

| | Percent |
|---|---|
| Suspension 1 | 66.66 |
| 20% aqueous solution of the sodium salt of poly (styrene sulphonic acid) | 1.67 |
| Water | 31.67 |

This suspension is coated in such a way that upon drying 18.2 g. of dry substance are present per sq. m., which corresponds with a thickness of the light-sensitive layer of approximately 17 microns.

*Suspension 3*

| | Percent |
|---|---|
| Suspension 1 | 55.55 |
| 20% aqueous solution of the sodium salt of poly (styrene sulphonic acid) | 2.78 |
| Water | 41.67 |

This suspension is coated such that upon drying 14.5 g. of dry substance are present per sq. m., which corresponds with a thickness of the light-sensitive layer of approximatively 13.5 microns.

*Suspension 4*

| | Percent |
|---|---|
| Suspension 1 | 44.44 |
| 20% aqueous solution of the sodium salt of poly (styrene sulphonic acid) | 4.44 |
| Water | 51.12 |

This suspension is coated in such a way that upon drying 11.4 g. of dry substance are present per sq. m., which corresponds with a thickness of the light-sensitive layer of approximately 10.5 microns.

The poly(styrene sulphonic acid) used has been prepared by sulphonating polystyrene having a molecular weight of approximatively 5,000 in concentrated sulphuric acid. The resulting poly(styrene sulphonic acid) contains one sulphonic acid group per benzene nucleus.

Each of these photogravure films is exposed successively to a screen and to a same grey-wedge. The exposed light-sensitive materials are than tanningly developed and transferred to a copper plate. After the unhardened areas have been washed away, etching resists having a thickness of approximately 24, 16, 13 and 10 microns respectively are obtained. The materials are then etched with a solution of iron (III) chloride of 41.5° Bé. The times needed for etching the grey-wedges completely are respectively:

| | Min. |
|---|---|
| 1 | 24 |
| 2 | 18½ |
| 3 | 20½ |
| 4 | 22 |

TEST 2

Pigment gelatin is applied to two supports of porous paper from the following compositions respectively:

| | To the first support | To the second support |
|---|---|---|
| Water, cc | 67 | 77 |
| Gelatin, g | 10 | 11.4 |
| Glue, g | 4.5 | 5 |
| 2% aqueous solution of sodium methyl-cellulose-m-sulphobenzoate, cc | 25 | |
| Iron (III) oxide, g | 9 | 5 |
| Sulphonated castor oil, cc | 3 | 3 |

The ethyl cellulose-m-sulphobenzoate used manifests a degree of substitution of 2.45 of ethoxyl groups and of 0.3 of m-sulphobenzoyl groups. The viscosity of a 5% solution in toluene/ethanol (80:20) of the ethyl cellulose, from which the ethyl cellulose-m-sulphobenzoate has been prepared, amounts to 6 to 8 cps. at 25° C.

The composition is coated such that, upon drying, the thickness of the pigment gelatin layer on the first support is 30 microns and 50 microns on the second support. For convenience the resulting materials are designated as first material and second material.

Both materials are soaked with a 3.5% aqueous solution of potassium dichromate and subsequently glazed. The materials are exposed successively to a screen and to a continuous tone diapositive having densities from 0.3 to 1.65 by means of an open arc lamp. These materials are then transferred in the usual manner to a copper plate, washed in water of 45° C. and dried. For etching use is made of a solution of iron (III) chloride of 41.5° Bé. The etching resist obtained from the first material manifests a thickness of 10 microns, whereas the etching resist obtained from the second material displays a thickness of 21 microns.

On the etching resist having a thickness of 10 microns the etching liquid needs 22 min. for penetrating to the copper at the areas corresponding with the brightest areas of the diapositive, whereas on the etching resist having a thickness of 21 microns 24 min. are needed.

I claim:

1. Process for the production of photogravure printing plates comprising exposing a light-sensitive layer selected from the group consisting of (a) a dichromate-sensitised layer having a thickness of at most 30 microns, and containing hardenable hydrophilic colloid and a member selected from the group consisting of a high molecular weight substance insoluble in acid medium and a high molecular weight substance, which in acid medium forms with the hydrophilic colloid an insoluble complex, and (b) a light-sensitive silver halide emulsion layer having a thickness of at most 20 microns, and containing hardenable hydrophilic colloid and a member selected from the group consisting of a high molecular weight substance insoluble in acid medium and a high molecular weight substance, which in acid medium forms with the hydrophilic colloid an insoluble complex, to a continuous tone original and through a screen, and hardening said light-sensitive layer in the exposed areas, applying said light-sensitive layer to the metal surface to be etched, removing the unhardened areas and etching the metal surface through the resulting etching resist with a solution of iron (III) chloride.

2. Process according to claim 1, wherein polyvinyl alcohol is utilised as hardenable hydrophilic colloid.

3. Process according to claim 2, wherein a water-soluble salt of ethyl cellulose-sulphobenzoic acid is utilised as high molecular weight substance.

4. Pigment paper comprising successively a paper support and a dichromate-sensitised layer having a thickness of at most 30 microns and containing hardenable hydrophilic colloid, and a member selected from the group consisting of a high molecular weight substance insoluble in acid medium and a high molecular weight substance forming in acid medium an insoluble complex with the hydrophilic colloid.

5. Photogravure film comprising successively a hydrophobic flexible support, a hydrophobic flexible membrane releasably joined to said support and a light-sensitive silver halide emulsion layer joined to said membrane, said light-sensitive layer having a thickness of at most 20 microns and comprising hardenable hydrophilic colloid and a member selected from the group consisting of a high molecular weight substance insoluble in acid medium and a high molecular weight substance forming in acid medium an insoluble complex with the hydrophilic colloid.

6. The process of claim 1 wherein gelatin is utilised as said hardenable hydrophilic colloid.

7. The process of claim 6 wherein said high molecular weight substance is polystyrene sulphonic acid or a water-soluble salt thereof.

No references cited.

NORMAN G. TORCHIN, *Primary Examiner.*

R. E. MARTIN, *Assistant Examiner.*